United States Patent [19]

Awane et al.

[11] 4,194,214
[45] * Mar. 18, 1980

[54] INTEGRATION OF HIGH VOLTAGE DRIVER AND LOW VOLTAGE LOGIC IN A SEMICONDUCTOR DEVICE

[75] Inventors: Katunobu Awane, Ikoma; Hironori Hattori, Suita; Tetuo Biwa, Osaka; Hiroshi Tamaki, Tenri, all of Japan

[73] Assignee: Sharp Kabushiki Kaisha, Osaka, Japan

[*] Notice: The portion of the term of this patent subsequent to Nov. 15, 1994, has been disclaimed.

[21] Appl. No.: 827,677

[22] Filed: Aug. 25, 1977

[30] Foreign Application Priority Data

Aug. 26, 1976 [JP] Japan .................................. 51-102296

[51] Int. Cl.² ...................... H01L 27/04; H01L 29/78
[52] U.S. Cl. .................................. 357/41; 315/169.3; 357/13; 357/53; 357/89; 357/23
[58] Field of Search ........................ 357/23, 41, 4, 53

[56] References Cited

U.S. PATENT DOCUMENTS

| 3,493,812 | 2/1970 | Weimer | 357/4 |
| 3,564,135 | 2/1971 | Weimer | 357/4 |
| 3,988,761 | 10/1976 | Kanazawa | 357/23 |
| 3,996,655 | 12/1976 | Cunningham et al. | 357/23 |
| 4,058,822 | 11/1977 | Awane et al. | 357/23 |

OTHER PUBLICATIONS

Blanchard et al., IEEE J. of Solid State Circuits, vol. SC9, No. 3, Jun. 1974, pp. 103, 108–109.
Saraswat et al., IEEE J. of Solid State Circuits, vol. SC-10, No. 3, Jun. 1975, pp. 136–137, 142.

Primary Examiner—William D. Larkins
Attorney, Agent, or Firm—Birch, Stewart, Kolasch & Birch

[57] ABSTRACT

High voltage diffusion-self-alignment metal oxide semiconductor devices and control logic circuitry therefor are integrated in a single semiconductor body. The integrated semiconductor device includes a considerably large number of output terminals compared to the number of input terminals. The output terminals develop signals of high voltages derived from the high voltage diffusion-self-alignment metal oxide semiconductor devices which are positioned at a peripheral zone of the semiconductor body.

3 Claims, 7 Drawing Figures

INTEGRATION OF HIGH VOLTAGE DRIVER AND LOW VOLTAGE LOGIC IN A SEMICONDUCTOR DEVICE

BACKGROUND OF THE INVENTION

The present invention relates to a high voltage diffusion-self-alignment metal oxide semiconductor device.

The present invention relates, more particularly, to a semi-conductor device which integrally includes a high voltage diffusion-self-alignment metal oxide semiconductor device and low voltage control logic circuitry.

Generally, a flat display panel such as a plasma display panel and an electroluminescence matrix display panel, and an electrostatic printer, etc. require a high voltage driver. The above-mentioned flat display panel and the electrostatic printer include a great number of electrodes, and the high voltage driver is required for the respective electrodes. That is, a greater number of high voltage drivers are provided to which control signals are applied to drive the flat display panel or the electrostatic printer.

In the conventional system, the high voltage drivers are discrete form logic circuits for developing the control signals to be applied to the high voltage drivers and, therefore, a great number of wirings are required for connecting the logic circuits to the high voltage drivers, respectively, and for connecting the high voltage drivers to the electrodes included within the flat display panel or the electrostatic printer, respectively. These wirings occupy a large area and are therefore not suited for a compact drive system.

OBJECTS AND SUMMARY OF THE INVENTION

Accordingly, an object of the present invention is to provide an integrated semiconductor device including a high voltage driver and low voltage logic circuitry therefor formed in a single semiconductor body.

Another object of the present invention is to integrate a high voltage driver and low voltage logic in a single semiconductor body through the use of diffusion-self-alignment techniques.

Still another object of the present invention is to provide a control circuit integrated in a single semiconductor body for driving a flat display panel such as an EL matrix display panel.

Yet another object of the present invention is to minimize a required number of input terminals of a driver circuit for a flat display panel such as an EL matrix display panel.

Other objects and further scope of applicability of the present invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

To achieve the above objects, pursuant to an embodiment of the present invention, high voltage diffusion-self-alignment metal oxide semiconductor devices and low voltage control logic are integrated in a single semiconductor body through the use of diffusion-self-alignment techniques. The high voltage diffusion-self-alignment metal oxide semiconductor device includes a drain field plate, a gate field plate and a pinched resistor layer, which, in combination, provide high voltage characteristics.

A typical construction of the high voltage diffusion-self-alignment metal oxide semiconductor device is proposed in our copending U.S. application Ser. No. 691,874 "HIGH VOLTAGE, LOW ON-RESISTANCE DIFFUSION-SELF-ALIGNMENT METAL OXIDE SEMICONDUCTOR DEVICE AND MANUFACTURE THEREOF", filed on June 1, 1976 now U.S. Pat. No. 4,058,822. In the high voltage diffusion-self-alignment metal oxide semiconductor device proposed in our copending application, a P+ channel region and an N+ source region are formed on a P− silicon body through the use of a double diffusion technique in a circular configuration. An N+ drain contact region is formed on the center surface of the P− silicon body. An N− active pinched resistor layer is formed on the surface of the silicon body to extend between the N+ drain contact region and the P+ channel region. A field plate or overlay metallization is disposed on an insulating layer adjacent the drain metallization and extends outwardly towards the gate metallization so that it overlies substantially all of the depletion region near the drain contact. Another field plate of smaller size is disposed on an insulating layer adjacent the gate metallization and extends inwardly towards the drain metallization, to thereby prevent avalanche breakdown at the channel region.

The integrated semiconductor device includes a considerably great number of output terminals with respect to input terminals. The output terminals develop signals of high voltages derived from the high voltage diffusion-self-alignment metal oxide semiconductor devices to drive a flat display panel such as an EL matrix display panel and a plasma display panel. The low voltage control logic circuits are positioned at the center of the semi-conductor body, and the high voltage diffusion-self-alignment metal oxide semiconductor drivers are positioned at a peripheral zone of the semiconductor body.

The integrated semiconductor device of the present invention is suited for high voltage and high speed drive. A typical characteristic is as follows:
  clock frequency: 10 MH$_Z$,
  transconductance: 15 m $\mho$,
  OFF-state break down voltage: 600 V,
  ON-state break down voltage: 300 V.

BRIEF DESCRIPTION OF THE DRAWINGS

The present invention will be better understood from the detailed description given hereinbelow and the accompanying drawings which are given by way of illustration only, and thus are not limitative of the present invention and wherein.

DESCRIPTION OF THE PREFERRED EMBODIMENTS

Referring now in detail to the drawings, and to facilitate a more complete understanding of the present invention, a typical drive system for a flat display panel will be first described with reference to FIGS. 1 and 2.

Figure 1:
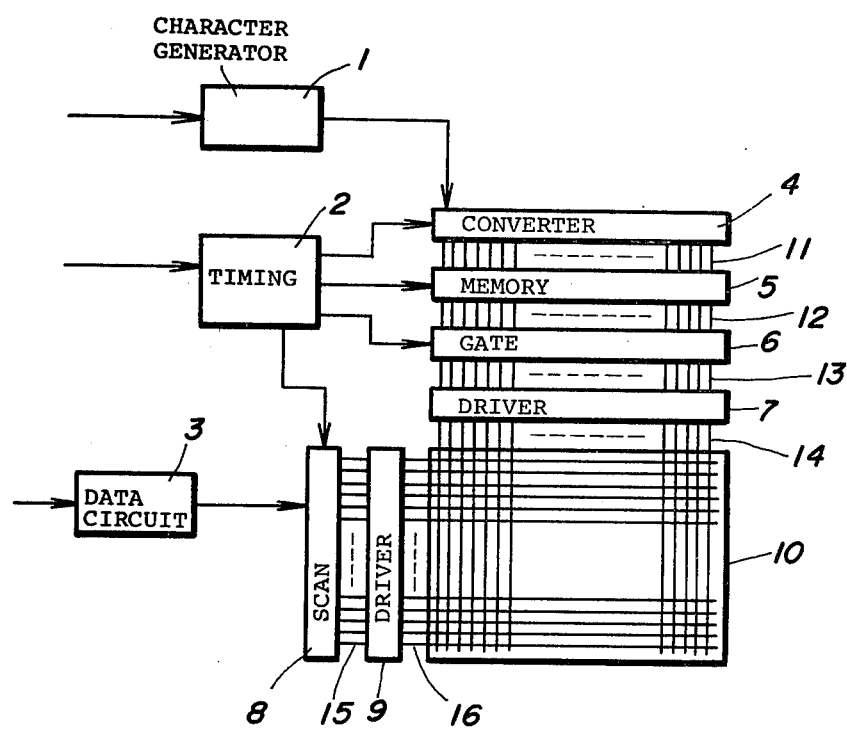
FIG. 1 is a block diagram of a flat display panel, a typical driver circuit and a control logic thereof.
Figure 2:
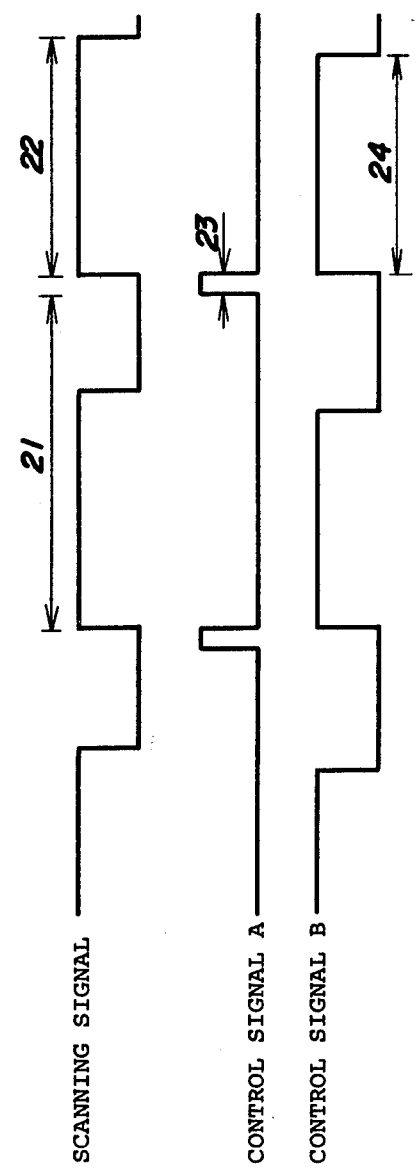
FIG. 2 is a time chart showing control signals to be applied to the system of FIG. 1.

FIG. 1 shows an example of a drive system of the scanning type for driving a flat display panel such as an EL matrix display panel. A flat display panel 10 includes a plurality of X-direction electrodes and Y-direction electrodes. Respective points where X-direction electrodes cross the Y-direction electrodes function as picture points to achieve character display in a dot matrix fashion. The flat display panel 10 includes a great number of electrodes which receive high voltage driving signals. Usually, the flat display panel 10 includes several tens through several hundreds of electrodes in either the X-direction or the Y-direction. The respective electrodes must be independent of each other and require corresponding driver circuits 7 and 9.

That is, high voltage drivers 7 and 9 are required by the number identical with that of the electrodes. Moreover, gate circuits 6, memory circuits 5, serial-to-parallel converters 4 and scanning circuits 8 must correspond to the high voltage drivers 7 and 9 one by one. When the serial-to-parallel converters 4, the memory circuits 5, the gate circuits 6 and the high voltage drivers 7 are discrete from each other, a great number of wirings 11, 12 and 13 are required for respectively connecting the serial-to-parallel converters 4 to the memory circuits 5, the memory circuits 5 to the gate circuits 6, and the gate circuits 6 to the high voltage drivers 7. Additionally, a great number of wirings 15 are required for connecting the scanning circuits 8 to the high voltage drivers 9 when the scanning circuits 8 are discrete from the high voltage drivers 9.

Operation of the drive system of FIG. 1 will be described with reference to FIG. 2.

A character signal generator 1 develops character signals, which are applied to the serial-to-parallel converters 4. The serial-to-parallel converters 4 transfer the character signals therein in response to clock signals derived from a timing source 2. When the serial-to-parallel convertors 4 are filled with character data derived from the character signal generator 1, the contents stored in the serial-to-parallel converters 4 are transferred to the memory circuits 5 during a time period 23 at which a control signal A derived form the timing source 2 takes the high level.

When the control signal A bears the low level, the serial-to-parallel converters 4 again receive the character data from the character signal generator 1. The data stored in the memory circuits 5 are transferred to the high voltage drivers 7 through the gate circuits 6 during a time period 24 where a control signal B derived from the timing source 2 takes the high level.

A data circuit 3 develops a control signal to the scanning circuits 8, which develop scanning signals to the high voltage drivers 9. During the time period 24, the high voltage drivers 9 develop high voltage driving signals to the flat display panel 10 and the high voltage drivers 7 develop high voltage driving signals to the flat display panel 10 to achieve the matrix drive.

The present inventors have developed an integrated semiconductor device which includes the serial-to-parallel converters 4, the memory circuits 5, the gate circuits 6 and the high voltage drivers 7, thereby eliminating external wirings 11, 12 and 13 for connecting the serial-to-parallel converters 4, the memory circuits 5, the gate circuits 6 and the high voltage drivers 7 to each other. Another integrated semiconductor device includes the scanning circuits 8 and the high voltage drivers 9, thereby eliminating external wirings 15.

Figure 3:
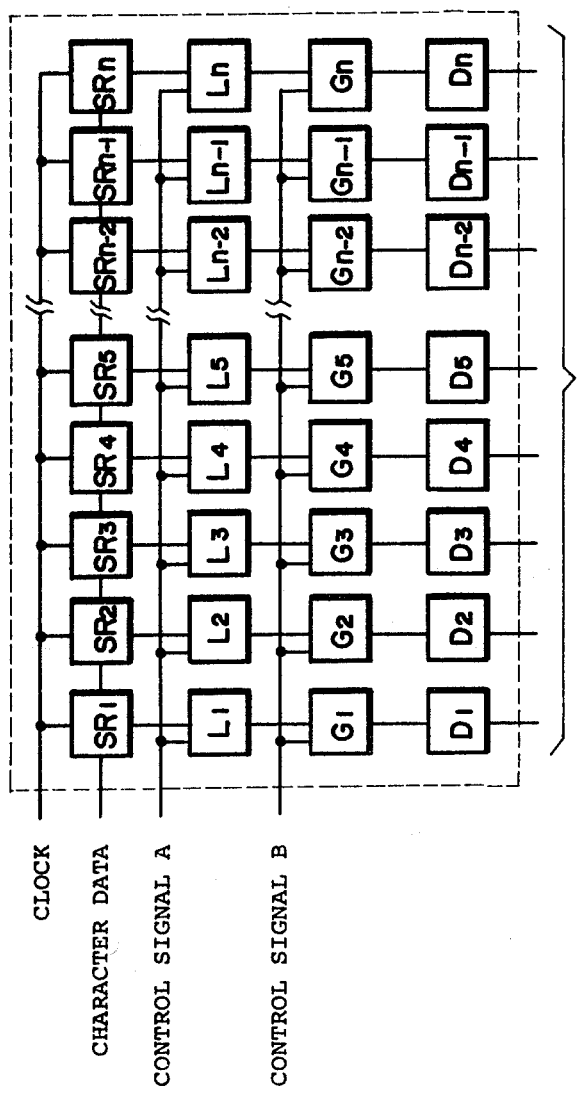
FIG. 3 is a schematic block diagram of an embodiment of an integrated semiconductor device of the present invention.

FIG. 3 shows an example of the integrated semiconductor device which includes shift registers $SR_1$ through $SR_n$ functioning as the serial-to-parallel converters 4, latches $L_1$ through $L_n$ functioning as the memory circuits 5, gate circuits $G_1$ through $G_n$, and high voltage driving elements $D_1$ through $D_n$ functioning as the high voltage drivers 7. The high voltage driving elements $D_1$ through $D_n$ are high voltage diffusion-self-alignment metal oxide semiconductor devices disclosed in our copending U.S. application Ser. No. 691,874 "HIGH VOLTAGE, LOW ON-RESISTANCE DIFFUSION-SELF-ALIGNMENT METAL OXIDE SEMICONDUCTOR DEVICE AND MANUFACTURE THEREOF" which is now U.S. Pat. No. 4,058,822. The integrated semiconductor device has only four signal input terminals.

To facilitate the fabrication of the integrated semiconductor device, it is preferable that both of the high voltage driving elements $D_1$ through $D_n$ and the control logic circuits including the shift registers $SR_1$ through $SR_n$, the Latches $L_1$ through $L_n$ and the gate circuits $G_1$ through $G_n$ are formed through the use of diffusion-self-alignment techniques.

FIGS. 4(a) through 4(d) show fabrication steps for constructing an embodiment of the integrated semiconductor device of the present invention through the use of diffusion-self-alignment techniques.

An insulating layer 31 such as $S_iO_2$ is formed on a P-type silicon semiconductor body 30. Resistivity values of the P-type silicon semiconductor body 30 are around seventy (70) ohm centimeters. The insulating layer 31 has thickness of 600–1500 Å. A photoresist mask 32 is formed on the insulating layer 31 in a desired configuration and, thereafter, an N-type ion is implanted through the insulating layer 31 to form an N-type ion implanted layer 41 at a position where the high voltage driving element will be formed as shown in FIG. 4(a).

The N-type ion implanted layer 41 is formed by implanting N-type dopant ions, such as phosphorus ions $^{31}P+$ or $^{34}P+$. The ion implantation is carried out in the condition of, for example, energy of implantation from one hundred (100) kiloelectronvolts to two hundred (200) kiloelectronvolts. The concentration of the implanted ions is from $5 \times 10^{11}$ particles/cm$^2$ to $5 \times 10^{12}$ particles/cm$^2$. The N-type ion implanted layer 41 is deeply driven in by the annealing treatment.

Thereafter, a thick insulating layer 33 is formed on the semi-conductor body 30 to the thickness of 6000 Å to 1.5 μm through the use of the oxidation treatment. Windows or openings 34, 35, 36 and 37 are formed in the thick insulating layer 33 through the use of a standard photolithographic techniques to expose the semiconductor body surface. Thin insulating $S_iO_2$ layers 38 and 39 are formed at the openings, and a photo-resist mask is formed in a desired configuration so that P-type dopant ions, for example, boron ions $^{11}B^+$, are implanted into the semiconductor body through the openings 35 and 37 to form P-type regions 42.

Figure 4:
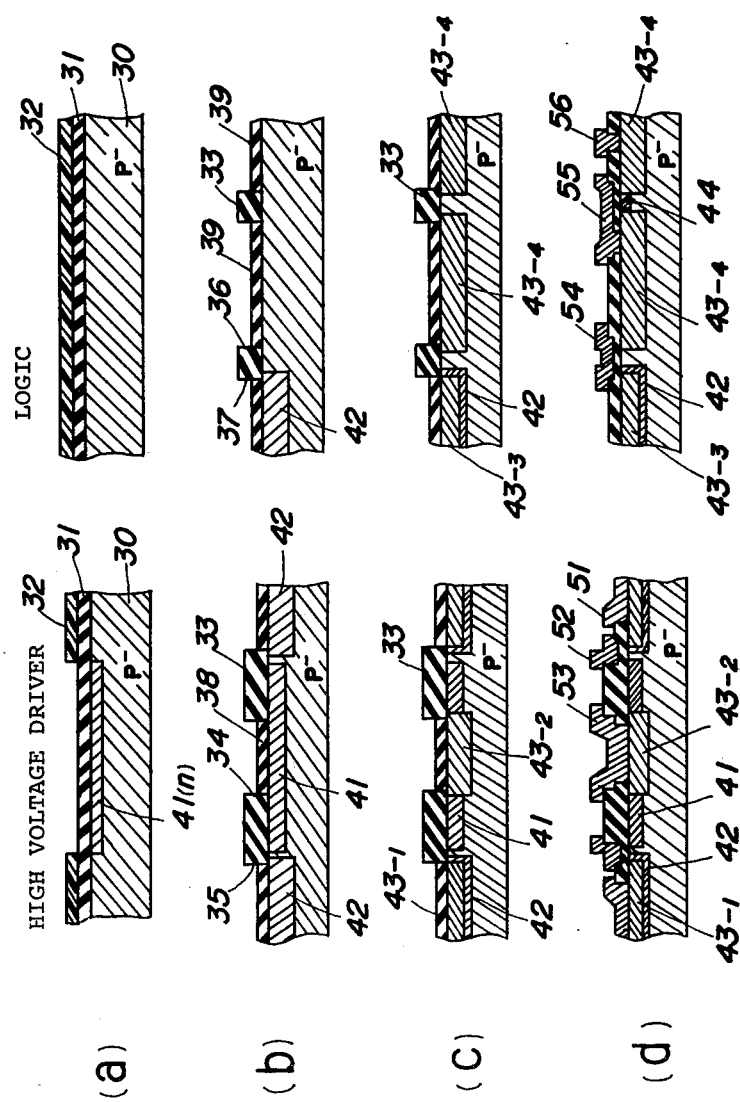
FIGS. 4(a) through 4(d) are cross-sectional views showing the method utilized for constructing an embodiment of an integrated semiconductor device of the present invention.

After completion of the boron ion implantation, the photo resist layer is removed, and the P-type ion implanted region 42 is extended to the surface covered by the thick insulating layer 33 through the use of annealing treatment as shown in FIG. 4(b).

This extended portion functions as a channel region. The implantation energy of the P-type ion is selectively determined from 45 KeV to 70 KeV, and the implantation density is also selectively determined from $5\times10^{13}$ particles/cm$^2$ to $2\times10^{14}$ particles/cm$^2$ in dependence on the desired depth of the P-type ion implanted region 42 and the concentration thereof. The annealing treatment is preferably carried out in a nitrogen atmosphere.

Then the thin insulating layers 38 and 39 are removed in a conventional manner, and an N-type impurity is diffused into the semiconductor body through the openings 34, 35, 36 and 37 to form N-type diffusion layers 43-1, 43-2, 43-3 and 43-4 as shown in FIG. 4(c). The N-type diffusion layers 43-1 and 43-3 are formed through the use of the openings 35 and 37 which are utilized to form the P-type ion implanted region 42.

Thereafter, an N-type ion implanted region 44 is formed to force the logic element into the depletion mode. Electrodes 51, 52 53, 54, 55 and 56 are formed in the conventional manner as shown in FIG. 4(d). The electrode 51 is the source electrode of the high voltage DSAMOS, the electrode 52 is the gate electrode of the high voltage DSAMOS and the electrode 53 is the drain electrode of the high voltage DSAMOS. The electrode 54 is the gate electrode of the logic element, the electrode 55 is the common electrode of the logic element and the electrode 56 is the drain electrode of the logic element.

Figure 5:
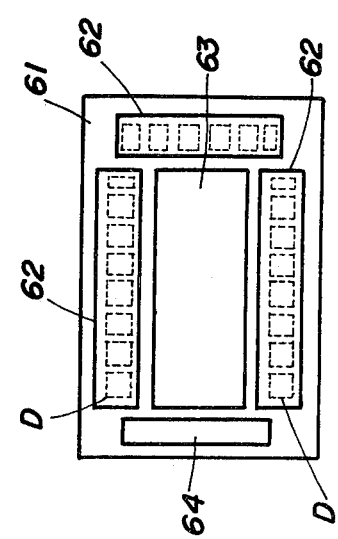
FIG. 5 is a plan view showing a layout of an embodiment of an integrated semiconductor device of the present invention.

FIG. 5 shows a typical layout of the integrated semiconductor device. The high voltage drivers are positioned at the periphery 62 of the semiconductor body 61, whereas the low voltage control logic is positioned at the center 63 of the semiconductor body 61. Input terminals are positioned at one end 64 of the semiconductor body 61. By this arrangement, the operation of the control logic is not influenced by the high voltage DSAMOS.

Figure 6:
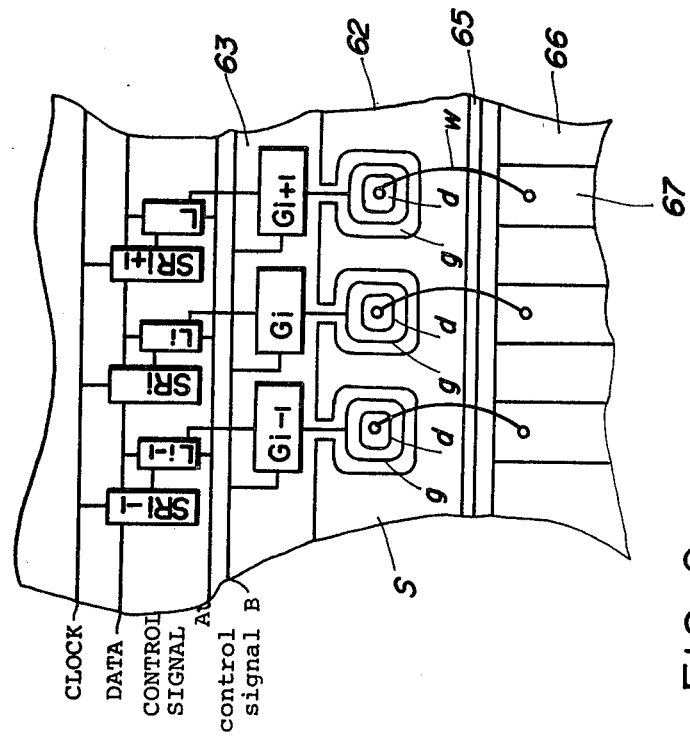
FIG. 6 is an enlarged plan view schematically showing a part of the integrated semiconductor device of FIG. 5.

FIG. 6 shows a typical arrangement of the control logic circuits and the high voltage drivers in the integrated semiconductor body. Like elements corresponding to those of FIGS. 3 and 5 are indicated by like numerals.

The high voltage DSAMOS includes the source s, the gate g and the drain d. Wirings w are provided for outputting drive signals through lead electrodes 67 formed on a ceramic substrate 66 which carries the integrated semiconductor device 65.

Figure 7:
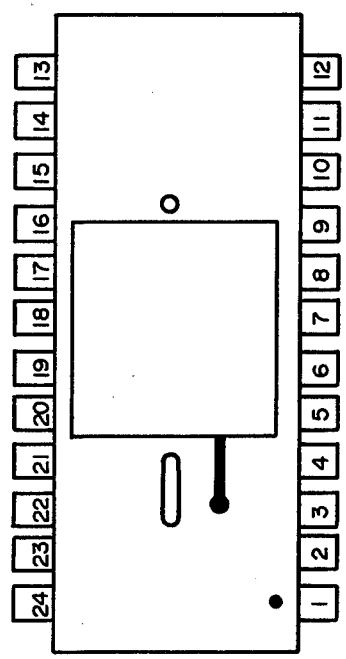
FIG. 7 is a plan view showing a layout of input and output terminals of the integrated semiconductor device of FIG. 5.

FIG. 7 shows an example of terminal arrangement of the integrated semiconductor device.

Terminals 1 through 24 are connected to develop the following drive signals or to receive the following control signals.

1. Latch Strobe Signal,
2. Gate Strobe Signal,
3. Ground,
4. Data IN-1,
5. High Voltage Output 1,
6. High Voltage Output 2,
7. High Voltage Output 3,
8. High Voltage Output 4,
9. High Voltage Output 5,
10. High Voltage Output 6,
11. High Voltage Output 7,
12. Data OUT-1,
13. Data IN-2,
14. High Voltage Output 1' (8),
15. High Voltage Output 2' (9),
16. High Voltage Output 3' (10),
17. High Voltage Output 4' (11),
18. High Voltage Output 5' (12),
19. High Voltage Output 6' (13),
20. High Voltage Output 7' (14),
21. Data OUT-2,
22. $V_{DD}$,
23. Clock Signal $\phi_2$,
24. Clock Signal $\phi_1$.

The invention being thus described, it will be obvious that the same may be varied in many ways. Such variations are not to be regarded as a departure from the spirit and scope of the invention, and all such modifications are intended to be included within the scope of the following claims.

What is claimed is:

1. An integrated semiconductor device for electronically driving a matrix display panel comprising:
   a semiconductor body means;
   a plurality of high voltage diffusion-self-alignment metal oxide field effect semiconductors integrally formed on said semiconductor body for applying driving voltages to said dislay panel, each of said high voltage semiconductors including,
      a drain region having a conductivity opposite that of the semiconductor body,
      a source region having a conductivity opposite that of the semiconductor body,
      a channel region of the same conductivity type as but more heavily doped than the semiconductor body, said channel region being formed to surround the source region,
      a drift channel region of the opposite conductivity type to that of the semiconductor body, said drift channel region being formed on the surface of the semiconductor body to extend between the drain and the channel regions, a drain electrode connected to the drain region,
      a source electrode connected to the source region,
      a gate electrode formed above the channel region via a thin insulating layer, and
      field plate means including a portion of said drain electrode extending toward said gate electrode to cover at least a portion of said drift channel region via a thick insulating layer; and
   a plurality of low voltage metal oxide field effect semiconductors integrally formed on said semiconductor body for selectively enabling said high voltage semiconductors.

2. The invention according to claim 1, wherein said matrix display panel is an electroluminescent display panel.

3. The integrated semiconductor device of claim 1, wherein said high voltage field effect semiconductors are formed at an outer peripheral area of said semiconductor body means, and said low voltage semiconductors are positioned at the center of said semiconductor body means.

* * * * *